United States Patent
Wakayama et al.

(10) Patent No.: US 9,914,666 B2
(45) Date of Patent: Mar. 13, 2018

(54) NANOHETEROSTRUCTURE AND METHOD FOR PRODUCING THE SAME

(71) Applicant: KABUSHIKI KAISHA TOYOTA CHUO KENKYUSHO, Nagakute-shi, Aichi (JP)

(72) Inventors: Hiroaki Wakayama, Nagoya (JP); Hirotaka Yonekura, Nagoya (JP); Hiromitsu Tanaka, Aichi-gun (JP)

(73) Assignee: KABUSHIKI KAISHA TOYOTA CHUO KENKYUSHO, Nagakute-shi (JP)

(*) Notice: Subject to any disclaimer, the term of this patent is extended or adjusted under 35 U.S.C. 154(b) by 294 days.

(21) Appl. No.: 14/848,650

(22) Filed: Sep. 9, 2015

(65) Prior Publication Data
US 2015/0376071 A1    Dec. 31, 2015

Related U.S. Application Data

(62) Division of application No. 13/635,787, filed as application No. PCT/JP2011/056196 on Mar. 16, 2011, now abandoned.

(30) Foreign Application Priority Data

Mar. 18, 2010 (JP) ................................. 2010-062705

(51) Int. Cl.
- *C04B 35/71* (2006.01)
- *C04B 35/628* (2006.01)
(Continued)

(52) U.S. Cl.
CPC ............ *C04B 35/71* (2013.01); *B22F 1/0044* (2013.01); *B22F 9/26* (2013.01); *B82Y 25/00* (2013.01);
(Continued)

(58) Field of Classification Search
CPC ......... C04B 35/71; C04B 35/628; B22F 9/22; B22F 1/0044; B82Y 30/00
See application file for complete search history.

(56) References Cited

U.S. PATENT DOCUMENTS 6,645,626 B2 * 11/2003 Garcia .................... B82Y 25/00
                                                                428/402
6,972,046 B2    12/2005 Sun et al.
(Continued)

FOREIGN PATENT DOCUMENTS

EP          2154734 A1     2/2010
JP       2003-258278 A     9/2003
(Continued)

OTHER PUBLICATIONS

T. Tsurumi et al., "Anomalous dielectric and optical properties in perovskite-type artificial superlattices," Science and Technology of Advanced Materials, 5 (2004), pp. 425-429.
(Continued)

*Primary Examiner* — George Wyszomierski
*Assistant Examiner* — Tina M McGuthry Banks
(74) *Attorney, Agent, or Firm* — Oliff PLC (57) ABSTRACT

A nanoheterostructure includes a first inorganic component and a second inorganic component one of which is a matrix, and the other of which is three-dimensionally and periodically arranged in the matrix, and has a three-dimensional periodic structure whose average value of one unit length of a repeated structure is 1 nm to 100 nm.

9 Claims, 2 Drawing Sheets

(51) Int. Cl.
- B22F 9/22 (2006.01)
- B22F 1/00 (2006.01)
- B82Y 30/00 (2011.01)
- C22B 9/22 (2006.01)
- B82Y 25/00 (2011.01)
- C01B 21/06 (2006.01)
- C01B 21/076 (2006.01)
- C01G 49/00 (2006.01)
- C01G 49/06 (2006.01)
- C01G 51/00 (2006.01)
- H01F 1/00 (2006.01)
- G02B 1/04 (2006.01)
- C01G 23/00 (2006.01)
- C04B 35/46 (2006.01)
- C04B 35/56 (2006.01)
- C04B 35/58 (2006.01)
- C04B 35/638 (2006.01)
- B22F 9/26 (2006.01)
- H01L 35/14 (2006.01)
- H01L 41/18 (2006.01)

(52) U.S. Cl.
CPC .......... B82Y 30/00 (2013.01); C01B 21/0635 (2013.01); C01B 21/0763 (2013.01); C01G 23/00 (2013.01); C01G 49/00 (2013.01); C01G 49/06 (2013.01); C01G 51/00 (2013.01); C04B 35/46 (2013.01); C04B 35/56 (2013.01); C04B 35/5805 (2013.01); C04B 35/58014 (2013.01); C04B 35/638 (2013.01); C22B 9/22 (2013.01); G02B 1/04 (2013.01); H01F 1/0063 (2013.01); H01F 1/0081 (2013.01); H01L 35/14 (2013.01); H01L 41/183 (2013.01); C01P 2002/01 (2013.01); C01P 2002/50 (2013.01); C01P 2004/03 (2013.01); C01P 2004/04 (2013.01); C01P 2004/30 (2013.01); C01P 2004/64 (2013.01); C04B 2235/3232 (2013.01); C04B 2235/3272 (2013.01); C04B 2235/3275 (2013.01); C04B 2235/3293 (2013.01); C04B 2235/3852 (2013.01); C04B 2235/44 (2013.01); C04B 2235/444 (2013.01); C04B 2235/5454 (2013.01); C04B 2235/663 (2013.01); C04B 2235/664 (2013.01); C04B 2235/80 (2013.01)

(56) References Cited

U.S. PATENT DOCUMENTS

| | | |
|---|---|---|
| 6,979,374 B2 | 12/2005 | Arai et al. |
| 7,158,346 B2 | 1/2007 | Liu et al. |
| 8,394,284 B2 | 3/2013 | Murai et al. |
| 2002/0164481 A1 | 11/2002 | Garcia et al. |
| 2002/0187197 A1 | 12/2002 | Caruso et al. |
| 2007/0027015 A1 | 2/2007 | Zhou et al. |
| 2008/0166476 A1 | 7/2008 | Akedo et al. |
| 2008/0248393 A1 | 10/2008 | Richard et al. |
| 2009/0088325 A1 | 4/2009 | Goyal et al. |
| 2009/0142256 A1* | 6/2009 | Wakayama ............ B82Y 30/00 423/630 |
| 2010/0054981 A1 | 3/2010 | Liu |

FOREIGN PATENT DOCUMENTS

| | | |
|---|---|---|
| JP | 2003-327782 A | 11/2003 |
| JP | 2005-511335 A | 4/2005 |
| JP | 2006-172584 A | 6/2006 |
| JP | 2008-523579 A | 7/2008 |
| JP | 2008-307661 A | 12/2008 |
| JP | 2009-138014 A | 6/2009 |
| JP | 2011-040459 A | 2/2011 |
| WO | 2006/137923 A2 | 12/2006 |
| WO | 2008/149871 A1 | 12/2008 |

OTHER PUBLICATIONS

Jul. 24, 2012 International Preliminary Report on Patentability issued for International Patent Application No. PCT/JP2011/056196 (with translation).

Teranishi et al., "Conversion of Anisotropically Phase-Segregated Pd/?-Fe2O3 Nanoparticles into Exchange-Coupled fct-FePd/?-Fe Nanocomposite Magnets," J. Am. Chem. Soc., 2008, vol. 130, pp. 4210-4211.

Aizawa et al., "Nanoscale Patterning of Two Metals on Silicon Surfaces Using an ABC Triblock Copolymer Template" J. Am. Chem. Soc., 2006, vol. 128, pp. 5877-5886.

Jun. 14, 2011 International Search Report issued in International Application No. PCT/JP2011/056196 (with translation).

* cited by examiner

NANOHETEROSTRUCTURE AND METHOD FOR PRODUCING THE SAME

This application is a Divisional Application of U.S. patent application Ser. No. 13/635,787 filed on Oct. 16, 2012, which in turn is a National Phase of International Application No. PCT/JP2011/056196 filed on Mar. 16, 2011, which claims priority to Japanese Patent Application No. 2010-062705 filed on Mar. 18, 2010. The disclosures of the prior applications are hereby incorporated by reference herein in their entireties.

TECHNICAL FIELD

The present invention relates to a nanoheterostructure comprising multiple inorganic components and having a nanoscale periodic structure, and to a method for producing the nanoheterostructure.

BACKGROUND ART

Nanostructured materials having a nanoscale regular arrangement, such as multi-layer structure materials having a repeated structure of several to several tens of nanometers, are expected to have different properties from those of normal materials. Nanostructured materials having a multi-layer structure are produced by, for example, a method in which layered crystals are exfoliated and deposited one layer by one layer by the layer-by-layer method (LBL method), a method in which thin films are deposited using a thin film forming technique such as sputtering, or other methods. However, since a multilayer structure is formed by sequentially depositing one layer by one layer in the LBL method or the method using a thin film forming technique, this brings about a problem that the procedure is complicated, especially when different kinds of material are used for every other layer. Moreover, some materials have a crystal structure which cannot be easily exfoliated and other materials cannot be formed into a film; accordingly, the kind of materials to which these methods are applicable is limited.

Further, US Patent Application Publication No. 2002/0187197 (PTL 1) discloses, in the specification, a method for producing a hollow polymer capsule having a multi layer structure. In the production method described in PTL 1, first, the surface of uncharged microcrystals is coated by self-assembly of charged surfactant molecules. Coating with the surfactant molecules makes continuous adsorption and deposition of polyelectrolytes possible. Each of the deposited polyelectrolyte layers has an opposite charge to that of a polyelectrolyte layer already adsorbed. Hence, electrolytes having charges opposite to each other are alternately deposited. Then, the coated uncharged microcrystals are removed by dissolution, and thereby a hollow polymer capsule having a multilayer structure is obtained. Nevertheless, the procedure of the method described in PTL 1 is also complicated because a multilayer structure is formed by sequentially depositing oppositely-charged polyelectrolyte layers one layer by one layer. In addition, although the hollow polymer capsule formed has a multilayer structure, deposition of the polyelectrolytes by adsorption results in a low degree of regularity.

Further, Japanese Unexamined Patent Application Publication No. 2003-327782 (PTL 2) discloses a method in which the surface of a substrate is coated with a composition containing a poly(methylphenylsilane) 3-methacryloxypropyltriethoxysilane (PMPS-co-PMPTES) block copolymer and $Ti(OC_2H_5)_4$, and then heated for sol-gel reaction, followed by decomposition and removal of the polysilane segment to thus form an inorganic porous thin film on the substrate. Nevertheless, in the method described in PTL 2, although a hybrid of (PMPS-co-PMPTES)-titanium oxide is formed, a regularly-arranged structure like multilayer structure is not obtained. Moreover, the composition of a material to be obtained by this method is limited.

Moreover, Teranishi et al., "Conversion of Anisotropically Phase-Segregated $Pd/\gamma$-$Fe_2O_3$ Nanoparticles into Exchange-Coupled fct-FePd/$\alpha$-Fe Nanocomposite Magnets", J. Am. Chem. Soc., 2008, 130, 4210-4211 (NPL 1) discloses a method in which oleic acid, oleylamine, and $Fe(acac)_3$ are dissolved in a Pd nanoparticles/1-octanol solution and then heated to synthesize $Pd/\gamma$-$Fe_2O_3$ nanoparticles having a $\gamma$-$Fe_2O_3$ phase anisotropically grown on the surface of the Pd nanoparticles, followed by calcination in a reducing gas atmosphere to obtain a FePd/$\alpha$-Fe nanocomposite material. Nevertheless, in the method described in NPL 1, the particle diameter of the FePd nanoparticles dispersed in the Fe matrix and the distance among the particles greatly vary, and a structure having a periodic structure is not obtained.

Furthermore, Aizawa et al., "Nanoscale Patterning of Two Metals on Silicon Surfaces Using an ABC Triblock Copolymer Template" J. Am. Chem. Soc., 2006, 128, 5877-5886 (NPL 2) discloses a method in which a thin film of a block polymer is formed on a Si substrate, a raw material solution of Au and Ag is brought into contact with and impregnate the surface of the thin film, and then the block polymer is removed to obtain a AuAg nanostructure. Nevertheless, by the method described in NPL 2, a nanoscale pattern is formed with Au and Ag, but the pattern is two-dimensional, and a structure having a three-dimensional periodic structure is not obtained.

Moreover, Japanese Unexamined Patent Application Publication No. 2009-138014 (PTL 3) discloses a method for producing a nanostructured material, comprising: a raw material solution preparation step of preparing a raw material solution by dissolving, in a solvent, a block copolymer comprising a first polymer block component and a second polymer block component which are immiscible but linked to each other, and an inorganic precursor coordinated to the first polymer block component but not coordinated to the second polymer block component; and a nanostructure-forming step of forming a nanophase-separated structure in which a first polymer phase comprising the first polymer block component with the inorganic precursor coordinated thereto and a second polymer phase comprising the second polymer block component are regularly arranged by self-assembly. Further, PTL 3 states that it is possible to obtain a nanostructured material comprising the inorganic component by removing the block copolymer having such a nanophase-separated structure. It is also described that a second inorganic precursor coordinated to the second polymer block component may be dissolved in the solvent.

CITATION LIST

Patent Literatures

[PTL 1] US Patent Application Publication No. 2002/0187197
[PTL 2] Japanese Unexamined Patent Application Publication No. 2003-327782
[PTL 3] Japanese Unexamined Patent Application Publication No. 2009-138014

Non Patent Literatures

[NPL 1] Teranishi et al., "Conversion of Anisotropically Phase-Segregated Pd/γ-Fe$_2$O$_3$ Nanoparticles into Exchange-Coupled fct-FePd/α-Fe Nanocomposite Magnets", J. Am. Chem. Soc., 2008, 130, 4210-4211

[NPL 2] Aizawa et al., "Nanoscale Patterning of Two Metals on Silicon Surfaces Using an ABC Triblock Copolymer Template" J. Am. Chem. Soc., 2006, 128, 5877-5886

SUMMARY OF INVENTION

Technical Problem

The method described in PTL 3 is excellent in that the method is capable of easily producing a nanostructured material in which the inorganic component is regularly arranged by utilizing self-assembly of the block copolymer. However, it is yet to obtain a nanoheterostructure in which an inorganic component having a three-dimensional nanoscale periodicity in such a shape as a spherical shape, a columnar shape, or a gyroid shape is arranged in a matrix made of another inorganic component.

The present invention has been made in view of the above-described problems of the conventional techniques. An object of the present invention is to provide: a nanoheterostructure in which an inorganic component having a three-dimensional specific nanoscale periodicity in such a shape as a spherical shape, a columnar shape, or a gyroid shape is arranged in a matrix made of another inorganic component; and a method for producing the nanoheterostructure.

Solution to Problem

The present inventors have earnestly studied in order to achieve the above object. As a result, the present inventors revealed that, if a first inorganic precursor having a solubility parameter different from that of a first polymer block component constituting a block copolymer by 2 (cal/cm$^3$)$^{1/2}$ or less is used in combination with a second inorganic precursor having a solubility parameter different from that of a second polymer block component by 2 (cal/cm$^3$)$^{1/2}$ or less, a nanophase-separated structure is formed by utilizing self-assembly of the block copolymer. In addition, if the inorganic precursors are converted respectively to inorganic components and the block copolymer is removed, a nanoheterostructure is obtained in which an inorganic component having a three-dimensional specific nanoscale periodicity is arranged in a matrix made of another inorganic component. This finding has led the inventors to complete the present invention.

Specifically, a method for producing a nanoheterostructure of the present invention is a method comprising:
a first step of preparing a raw material solution by dissolving, in a solvent,
a block copolymer comprising at least a first polymer block component and a second polymer block component which are immiscible but linked to each other,
a first inorganic precursor having a solubility parameter different from that of the first polymer block component by 2 (cal/cm$^3$)$^{1/2}$ or less, and
a second inorganic precursor having a solubility parameter different from that of the second polymer block component by 2 (cal/cm$^3$)$^{1/2}$ or less; and a second step including
a phase-separation treatment for forming a nanophase-separated structure in which at least a first polymer phase comprising the first polymer block component with the first inorganic precursor introduced thereinto and a second polymer phase comprising the second polymer block component with the second inorganic precursor introduced thereinto are regularly arranged by self-assembly,
a conversion treatment for converting the first inorganic precursor and the second inorganic precursor to a first inorganic component and a second inorganic component, respectively, and
a removal treatment for removing the block copolymer from the nanophase-separated structure, to thereby obtain a nanoheterostructure comprising the first inorganic component and the second inorganic component.

A solubility parameter difference between the first polymer block component and the first inorganic precursor used in the present invention is preferably smaller than a solubility parameter difference between the first polymer block component and the second inorganic precursor. Moreover, a solubility parameter difference between the second polymer block component and the second inorganic precursor is preferably smaller than a solubility parameter difference between the second polymer block component and the first inorganic precursor. Further, it is more preferable that these two conditions be satisfied.

The first inorganic precursor used in the present invention preferably has a solubility parameter different from that of the second polymer block component by more than 2 (cal/cm$^3$)$^{1/2}$. Moreover, the second inorganic precursor preferably has a solubility parameter different from that of the first polymer block component by more than 2 (cal/cm$^3$)$^{1/2}$. Further, it is more preferable that these two conditions be satisfied.

Furthermore, at least one of the first inorganic precursor and the second inorganic precursor preferably has a solubility parameter different from that of the solvent by 2 (cal/cm$^3$)$^{1/2}$ or less.

Furthermore, the second step in the present invention preferably includes a step of carrying out a treatment, such as a heat treatment, on the raw material solution or a dry matter thereof as the phase-separation treatment, the conversion treatment and the removal treatment. In addition, such a heat treatment is more preferably carried out in an inert gas atmosphere. In this case, the second step may further include, after the heat treatment in the inert gas atmosphere, any one of: an oxidization treatment for oxidizing the first inorganic component and the second inorganic component in an oxidizing gas atmosphere; and a reduction treatment for reducing the first inorganic component and the second inorganic component in a reducing gas atmosphere.

The nanoheterostructure of the present invention that can be obtained by the method of the present invention comprises a first inorganic component and a second inorganic component one of which is a matrix, and the other of which is three-dimensionally and periodically arranged in the matrix, wherein
the nanoheterostructure has a three-dimensional periodic structure whose average value of one unit length of a repeated structure is 1 nm to 100 nm (more preferably 1 nm to 50 nm).

In the nanoheterostructure of the present invention, the inorganic component three-dimensionally and periodically arranged in the matrix preferably has a shape selected from the group consisting of a spherical shape, a columnar shape, and a gyroid shape.

In addition, each of the first inorganic component and the second inorganic component is preferably at least one component selected from the group consisting of metals, oxides, carbides, nitrides, borides and salts, and more preferably at least one component selected from the group consisting of metals and metal oxides.

Furthermore, it is preferable that each of the first inorganic component and the second inorganic component be a magnetic material, and that the nanoheterostructure of the present invention be a composite magnetic material. In this case, it is more preferable that one of the first inorganic component and the second inorganic component be a hard magnetic material, and that the other be a soft magnetic material.

Figure 1:
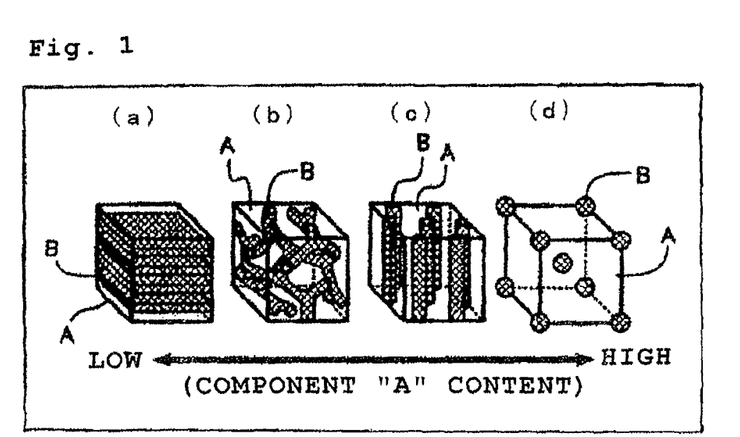
FIG. 1 shows schematic views illustrating nanophase-separated structures generated from A-B type block copolymers.

It should be noted that although it is not known exactly why the nanoheterostructure of the present invention can be obtained by the method of the present invention, the present inventors speculate as follows. Specifically, first, as described in PTL 3, a block copolymer comprising two kinds of polymer block components, A and B, which are immiscible but linked to each other forms a nanophase-separated structure in which a phase A and a phase B are spatially separate from each other (self-assembly) by being subjected to a heat treatment at or above a glass transition temperature. In this event, the phase-separated structure generally varies depending on the molecular weight ratio of the polymer block components. Specifically, when the molecular weight ratio of A:B is 1:1, generally a layered lamellar structure is formed. As the molecular weight ratio is changed from 1:1, the structure is changed from a gyroid structure in which two continuous phases are mingled with each other to a columnar structure, and further to a spherical structure. Note that FIG. 1 shows schematic views illustrating nanophase-separated structures generated from block copolymers. Shown from the left are: a lamellar structure (a), a gyroid structure (b), a columnar structure (c), and a spherical structure (d). Generally, the proportion of A in the structure on the right side is higher.

In the method for producing a nanoheterostructure of the present invention, first, multiple inorganic precursors having a three-dimensional nanoscale periodicity are arranged by utilizing the aforementioned self-assembly of a block copolymer. Specifically, a block copolymer comprising multiple polymer block components which are immiscible to each other phase-separates on a nanoscale by self-assembly as described above. In this event, in the present invention, a first inorganic precursor having a solubility parameter different from that of a first polymer block component constituting the block copolymer by 2 $(cal/cm^3)^{1/2}$ or less is used in combination with a second inorganic precursor having a solubility parameter different from that of a second polymer block component by 2 $(cal/cm^3)^{1/2}$ or less. Thereby, a nanophase-separated structure is formed with achievement of self-assembly of the block copolymer while the first inorganic precursor and the second inorganic precursor are sufficiently introduced into the first polymer block component and the second polymer block component, respectively. As the nanophase-separated structure is made to have a spherical structure, a columnar structure or a gyroid structure, the inorganic precursors having a three-dimensional nanoscale periodicity are arranged.

Further, in the present invention, the inorganic precursors are converted to inorganic components, respectively, and the block copolymer is removed. Thereby, a nanoheterostructure is obtained in which an inorganic component having a three-dimensional specific nanoscale periodicity in such a shape as a spherical shape, a columnar shape, or a gyroid shape is arranged in a matrix made of another inorganic component, in accordance with the type of the nanophase-separated structure (spherical structure, columnar structure or gyroid structure). Note that, in the present invention, since the solubility parameter differences between the first inorganic precursor and the first polymer block component and between the second inorganic precursor and the second polymer block component are 2 $(cal/cm^3)^{1/2}$ or less, a sufficiently large amount of the inorganic precursor is introduced into each polymer block component. For this reason, the present inventors speculate that even when the inorganic precursors are converted to the respective inorganic components and the block copolymer is removed, the three-dimensional nanoscale periodic structure is sufficiently kept.

Note that, in the present invention, the "solubility parameter" is a so-called "SP value" defined by the regular solution theory introduced by Hildebrand, and is a value obtained based on the following equation:

$$\text{Solubility parameter } \delta[(cal/cm^3)^{1/2}] = (\Delta E/V)^{1/2}$$

(where $\Delta E$ represents a molar energy of vaporization [cal], and V represents a molar volume [$cm^3$]).

Moreover, in the present invention, the "average value of one unit length of a repeated structure" is an average value of a distance between the centers of neighboring molecules of one inorganic component arranged in a matrix made of another inorganic component, and corresponds to a distance (d) of a so-called periodic structure. The distance (d) of such a periodic structure can be obtained by small-angle X-ray diffraction as follows. Moreover, the structure such as a spherical structure, a columnar structure, or a gyroid structure according to the present invention can also be specified by a characteristic diffraction pattern measured by a small-angle X-ray diffraction as follows.

Specifically, by small-angle X-ray diffraction, Bragg reflection is observed from characteristic lattice planes of a pseudo-crystalline lattice in which a structure having a shape such as a spherical shape, a columnar shape, a gyroid shape, or a lamellar shape is periodically arranged in a matrix. In this event, if a periodic structure is formed, diffraction peaks are observed, and a structure such as a spherical structure, a columnar structure, a gyroid structure, or a lamellar structure can be identified from the ratio of the intensities of these diffraction spectra ($q=2\pi/d$). Moreover, from the peak position of such a diffraction peak, the distance (d) of the periodic structure can be calculated according to Bragg' equation ($n\lambda=2d \sin \theta$; $\lambda$ represent the wavelength of an X-ray, and $\theta$ represents a diffraction angle). Table 1 below shows the relation between each structure and the ratio of intensities of diffraction spectra (q) at the peak position. Note that it is not necessary to check all the peaks as shown in Table 1, but it is only necessary to identify the structure from observed peaks.

TABLE 1

| Structure | Ratio of q at peak position |
| --- | --- |
| sphere | $1:\sqrt{2}:\sqrt{3}:\sqrt{4}: \ldots$ |
| column | $1:\sqrt{3}:\sqrt{4}:\sqrt{7}: \ldots$ |
| gyroid | $1:\sqrt{4/3}:\sqrt{7/3}:\sqrt{8/3}: \ldots$ |
| layer | $1:2:3:4: \ldots$ |

Further, it is possible to identify the structure such as a spherical structure, a columnar structure, a gyroid structure or a lamellar structure according to the present invention by using a transmission electron microscope (TEM) with which the shape and the periodicity can be determined and evaluated. Further, it is possible to determine the three-dimensionality more specifically by observations made in different directions or using three-dimensional tomography.

Advantageous Effects of Invention

The present invention makes it possible to provide: a nanoheterostructure in which an inorganic component having a three-dimensional specific nanoscale periodicity in such a shape as a spherical shape, a columnar shape, or a gyroid shape is arranged in a matrix made of another inorganic component; and a method for producing the nanoheterostructure.

DESCRIPTION OF EMBODIMENTS

Hereinafter, the present invention will be described in detail on the basis of preferred embodiments thereof. First, a method for producing a nanoheterostructure of the present invention will be described.

The method for producing a nanoheterostructure of the present invention is a method comprising:
a first step of preparing a raw material solution by dissolving, in a solvent,
 a block copolymer comprising at least a first polymer block component and a second polymer block component which are immiscible but linked to each other,
 a first inorganic precursor having a solubility parameter different from that of the first polymer block component by 2 $(cal/cm^3)^{1/2}$ or less, and
 a second inorganic precursor having a solubility parameter different from that of the second polymer block component by 2 $(cal/cm^3)^{1/2}$ or less; and
a second step including
 a phase-separation treatment for forming a nanophase-separated structure in which at least a first polymer phase comprising the first polymer block component with the first inorganic precursor introduced thereinto and a second polymer phase comprising the second polymer block component with the second inorganic precursor introduced thereinto are regularly arranged by self-assembly,
 a conversion treatment for converting the first inorganic precursor and the second inorganic precursor to a first inorganic component and a second inorganic component, respectively, and
 a removal treatment for removing the block copolymer from the nanophase-separated structure, to thereby obtain a nanoheterostructure comprising the first inorganic component and the second inorganic component. Hereinafter, each step will be described.

[First Step: Raw Material Solution Preparation Step]

This step is a step of preparing a raw material solution by dissolving, in a solvent, a block copolymer to be described below and inorganic precursors to be described below.

The block copolymer used in the present invention comprises at least a first polymer block component and a second polymer block component which are linked to each other. Specific examples of such a block copolymer include A-B type and A-B-A type block copolymers having a structure such as -(aa . . . aa)-(bb . . . bb)- in which a polymer block component A (first polymer block component) having a repeating unit a and a polymer block component B (second polymer block component) having a repeating unit b are linked end to end. Moreover, the block copolymer may be of a star type in which at least one polymer block component extends radially from a center, or of a type in which another polymer component is branched from the main chain of the block copolymer.

The kind of the polymer block components constituting the block copolymer used in the present invention is not particularly limited, as long as the polymer block components are immiscible to each other. Thus, the block copolymer used in the present invention preferably comprises polymer block components having different polarities. Specific examples of such a block copolymer include polystyrene-poly(methyl methacrylate) (PS-b-PMMA), polystyrene-poly(ethylene oxide) (PS-b-PEO), polystyrene-polyvinylpyridine (PS-b-PVP), polystyrene-polyisoprene (PS-b-PI), polystyrene-polybutadiene (PS-b-PB), polystyrene-poly(ferrocenyldimethylsilane) (PS-b-PFS), poly(ethylene oxide)-polyisoprene (PEO-b-PI), poly(ethylene oxide)-polybutadiene (PEO-b-PB), poly(ethylene oxide)-poly(methyl methacrylate) (PEO-b-PMMA), poly(ethylene oxide)-poly(ethyl ethylene) (PEO-b-PEE), polybutadiene-polyvinylpyridine (PB-b-PVP), polyisoprene-poly(methyl methacrylate) (PI-b-PMMA), polystyrene-poly(acrylic acid) (PS-b-PAA), polybutadiene-poly(methyl methacrylate) (PB-b-PMMA), and the like. Above all, PS-b-PVP, PS-b-PEO, PS-b-PAA, and the like are preferable from the viewpoint that precursors are likely to be introduced into the respective polymer block components. This is because if the polymer block components greatly differ from each other in polarity, precursors which greatly differ from each other in polarity can also be used for the introduction.

The molecular weight of the block copolymer and the polymer block components constituting the block copolymer can be selected as appropriate in accordance with the structure scale and arrangement of a nanoheterostructure to be produced. For example, it is preferably to use a block copolymer having a number average molecular weight of 100 to 10/000,000 (more preferably 1000 to 1,000,000). There is a tendency that the lower the number average molecular weight, the smaller the structure scale. Moreover, with regards to the number average molecular weight of the polymer block components, by adjusting the molecular weight ratio of each polymer block component, a nanophase-separated structure to be obtained by self-assembly in the subsequent nanophase-separated structure-forming step can have a desired structure. Accordingly, a nanoheterostructure having a structure in which inorganic components are arranged in a desired form can be obtained. It is also preferable to use a block copolymer which is easily decomposed by a heat treatment (calcination) or light irradiation to be described later, or a block copolymer which is easily removed with a solvent.

In the present invention, a first inorganic precursor having a solubility parameter different from that of the first polymer block component by 2 $(cal/cm^3)^{1/2}$ or less and a second inorganic precursor having a solubility parameter different from that of the second polymer block component by 2 $(cal/cm^3)^{1/2}$ or less need to be used in combination. By using the first inorganic precursor and the second inorganic precursor satisfying such conditions in combination, a nanophase-separated structure is formed with achievement of self-assembly of the block copolymer in the step of forming the nanophase-separated structure described later, while the first inorganic precursor and the second inorganic precursor are sufficiently introduced into the first polymer block component and the second polymer block component, respectively. As the nanophase-separated structure is made to have a spherical structure, a columnar structure or a gyroid structure, the inorganic precursors having a three-dimensional nanoscale periodicity are arranged.

A solubility parameter difference between the first polymer block component and the first inorganic precursor used in the present invention is preferably smaller than a solubility parameter difference between the first polymer block component and the second inorganic precursor. Moreover, a solubility parameter difference between the second polymer block component and the second inorganic precursor is preferably smaller than a solubility parameter difference between the second polymer block component and the first inorganic precursor. Further, it is more preferable that these two conditions be satisfied.

Furthermore, the first inorganic precursor used in the present invention preferably has a solubility parameter different from that of the second polymer block component by more than 2 $(cal/cm^3)^{1/2}$. Moreover, the second inorganic precursor preferably has a solubility parameter different from that of the first polymer block component by more than 2 $(cal/cm^3)^{1/2}$. Further, it is more preferable that these two conditions be satisfied.

By using the first inorganic precursor and the second inorganic precursor satisfying such conditions in combination, portions of the second inorganic precursor and the first inorganic precursor tend to be more surely prevented from being introduced as impurities into the first polymer block component and the second polymer block component, respectively, in the step of forming the nanophase-separated structure described later. Moreover, the purity of the inorganic component constituting a matrix in a nanoheterostructure to be obtained and/or the purity of the inorganic component arranged in the matrix tend to be more improved.

In addition, preferably at least one (more preferably both) of the first inorganic precursor and the second inorganic precursor has a solubility parameter different from that of the solvent used by 2 $(cal/cm^3)^{1/2}$ or less. By using the first inorganic precursor and/or the second inorganic precursor satisfying such a condition, the inorganic precursors tend to be more surely dissolved in the solvent, and the inorganic precursors tend to be more surely introduced into the polymer block components in the step of forming the nanophase-separated structure described later.

Such inorganic precursors are preferably at least one selected from the group consisting of various salts (for example, carbonates, nitrates, phosphates, sulfates, chlorides, and the like of metals or metalloids), various alkoxides (for example, methoxides, ethoxides, propoxides, butoxides, and the like containing metals or metalloids), various complexes (for example, acetylacetonate complexes and the like of metals or metalloids), and various organometallic compounds (for example, phenyltrimethoxysilane, cobaltocene, and the like). These are selected and used as appropriate, in accordance with the combination of the inorganic components constituting the targeted nanoheterostructure and so as to satisfy the above-described conditions. The inorganic components after the conversion are each preferably at least one selected from the group consisting of oxides, metals, carbides, nitrides, borides and salts to be described later. From the viewpoint that it is possible to expect that various functions are demonstrated, the inorganic component preferably contains at least one element selected from the group consisting of iron (Fe), aluminium (Al), niobium (Nb), cobalt (Co), nickel (Ni), platinum (Pt), tellurium (Te), titanium (Ti) and silicon (Si). Accordingly, examples of the inorganic precursors suitably used in the present invention include: salts such as carbonates, nitrates, phosphates, sulfates, and chlorides containing the above element; alkoxides such as methoxides, ethoxides, propoxides, and butoxides containing the above element; complexes such as acetylacetonates including $Fe(acac)_3$, $Co(acac)_3$, $Pt(acac)_2$, and $Ni(acac)_2$; and organometallic compounds such as phenyltrimethoxysilane and cobaltocene.

The solvent used in the present invention is not particularly limited, as long as the solvent is capable of dissolving the block copolymer and the first and second inorganic precursors to be used. Examples of the solvent include acetone, tetrahydrofuran (THF), toluene, propylene glycol monomethyl ether acetate (PGMEA), propylene glycol monomethyl ether (PGME), chloroform, benzene, and the like. One kind of such solvents can be used alone, or a mixture of two or more kinds can be used.

Note that, in the present description, "to dissolve" means a phenomenon that a substance (solute) is dissolved in a solvent to form a homogeneous mixture (solution), and includes cases where after dissolving, at least part of the solute becomes ions, where the solute is not dissociated into ions but exists in the form of molecule, where the solute exist as associating molecules and ions, and other cases.

The ratios of the solutes (the block copolymer, the first inorganic precursor and the second inorganic precursor) in the obtained raw material solution are not particularly limited. When a total amount of the raw material solution is set to 100% by mass, the total of the solutes is preferably around 0.1 to 30% by mass, more preferably 0.5 to 10% by mass. Further, by adjusting amounts of the first and second inorganic precursors used relative to the block copolymer, the amount of each inorganic component to be introduced is adjusted, so that the ratio, size, and so on of each inorganic component in a nanoheterostructure to be obtained can be at desired levels.

[Second Step: Nanoheterostructure-Forming Step]

This step is a step including a phase-separation treatment, a conversion treatment, and a removal treatment, which are to be described in detail below, to thereby prepare a nanoheterostructure comprising the first inorganic component and the second inorganic component.

First, the raw material solution prepared in the first step contains the block copolymer and the first and second inorganic precursors. In the present invention, the first inorganic precursor having a solubility parameter different from that of the first polymer block component constituting the block copolymer by 2 $(cal/cm^3)^{1/2}$ or less is used in combination with the second inorganic precursor having a solubility parameter different from that of the second polymer block component by 2 $(cal/cm^3)^{1/2}$ or less. Accordingly, the first inorganic precursor and the second inorganic precursor exist in such a state that the first and second inorganic precursors are sufficiently introduced into the first polymer block component and the second polymer block component, respectively. Hence, by the phase-separation treatment, a nanophase-separated structure is formed in which a first polymer phase comprising the first polymer block component with the first inorganic precursor introduced thereinto and a second polymer phase comprising the second polymer block component with the second inorganic precursor introduced thereinto are regularly arranged by self-assembly of the block copolymer. As the nanophase-separated structure is made to have a spherical structure, a columnar structure or a gyroid structure, the inorganic precursors having a three-dimensional nanoscale periodicity are arranged.

Such a phase-separation treatment is not particularly limited. By carrying out a heat treatment at or above the glass transition temperature of the block copolymer used, self-assembly of the block copolymer is achieved, and the phase-separated structure is obtained.

Next, in the present invention, the nanophase-separated structure formed by the phase-separation treatment is subjected to: the conversion treatment for converting the first inorganic precursor and the second inorganic precursor to a first inorganic component and a second inorganic component, respectively; and the removal treatment for removing the block copolymer from the nanophase-separated structure. As the inorganic precursors are converted to the respective inorganic components by such a conversion treatment and the block copolymer is removed by the removal treatment, the nanoheterostructure of the present invention is obtained in which an inorganic component having a three-dimensional specific nanoscale periodicity in such a shape as a spherical shape, a columnar shape, or a gyroid shape is arranged in the matrix made of another inorganic component, in accordance with the type of the nanophase-separated structure (spherical structure, columnar structure or gyroid structure).

Such a conversion treatment may be: a step of heating at or above a temperature at which the inorganic precursors are converted to the inorganic components for conversion to the inorganic components; or a step of subjecting the inorganic precursors to hydrolysis and dehydration condensation for conversion to the inorganic components.

Moreover, the removal treatment may be: a step of decomposing the block copolymer by a heat treatment (calcination) at or above a temperature at which the block copolymer is decomposed; a step of removing the block copolymer by dissolving the block copolymer in a solvent; or a step of decomposing the block copolymer by light irradiation such as ultraviolet irradiation.

Further, in the second step of the present invention, if the raw material solution prepared in the first step is subjected to a heat treatment (calcination) at or above a temperature at which the block copolymer is decomposed, the phase-separation treatment, the conversion treatment and the removal treatment can be conducted all in one heat treatment. In order to complete the phase-separation treatment, the conversion treatment and the removal treatment by only one heat treatment in this manner, the heat treatment is carried out preferably at 300 to 1200° C. (more preferably 400 to 900° C.) for approximately 0.1 to 50 hours, although the conditions vary depending on the kind of the block copolymer and the inorganic precursors to be used.

In addition, such a heat treatment is preferably carried out in an inert gas atmosphere (for example, in a nitrogen gas or the like). When the inorganic precursors are converted to the inorganic components and the block copolymer is removed in an inert gas atmosphere, the three-dimensional nanoscale periodic structure tends to be kept more surely. The condition of the heat treatment in such an inert gas atmosphere is not particularly limited. The treatment is preferably carried out at 300 to 1200° C. (more preferably 400 to 900° C.) for approximately 0.1 to 50 hours.

Furthermore, after such a heat treatment in an inert gas atmosphere, it is possible to further carry out any one of: an oxidization treatment for oxidizing the first inorganic component and the second inorganic component in an oxidizing gas atmosphere (for example, in air or the like); and a reduction treatment for reducing the first inorganic component and the second inorganic component in a reducing gas atmosphere (for example, in hydrogen or the like). Note that the condition of the oxidization treatment in such an oxidizing gas atmosphere is not particularly limited. The treatment is preferably carried out at 300 to 1200° C. (more preferably 400 to 900° C.) for approximately 0.1 to 50 hours. In addition, the condition of the reduction treatment in the reducing gas atmosphere is not particularly limited, either. The treatment is preferably carried out at 300 to 1200° C. (more preferably 400 to 900° C.) for approximately 0.1 to 50 hours.

Additionally, after the heat treatment or during the heat treatment, it is possible to further carry out a carbonization treatment on the inorganic components using an argon atmosphere or the like, a nitrogenization treatment on the inorganic components using an ammonia atmosphere or the like, a boronization treatment on the inorganic components using a boron carbide containing-atmosphere or the like, or other treatment by a known method for each treatment.

Furthermore, the method for producing a nanoheterostructure of the present invention may further comprise, after the first step, a coating step of coating a surface of a substrate with the raw material solution. By performing the second step after the surface of the substrate is coated with the raw material solution, a coating film comprising the nanoheterostructure is formed on the surface of the substrate. The kind of the substrate to be used is not particularly limited, and can be selected as appropriate in accordance with the use or the like of the nanoheterostructure to be obtained. Moreover, as the coating method with the raw material solution, brush coating, spraying, dipping, spinning, curtain flow coating, or the like is used.

Next, description will be given of a nanoheterostructure of the present invention that can be obtained by the method of the present invention.

The nanoheterostructure of the present invention comprises a first inorganic component and a second inorganic component one of which is a matrix, and the other of which is three-dimensionally and periodically arranged in the matrix, wherein
the nanoheterostructure has a three-dimensional periodic structure whose average value of one unit length of a repeated structure is 1 nm to 100 nm (more preferably 1 nm to 50 nm, particularly preferably 1 nm to 20 nm).

Such a nanoheterostructure of the present invention has a structure that has not been formed by conventional production methods. It is possible to obtain nanoheterostructures in which the arrangement, composition, structure scale, and the like of various combinations of the multiple inorganic components are controlled in various ways. Therefore, the nanoheterostructure of the present invention demonstrates an interface increasing effect, a nanosize effect, and significant improvements in durability and the like when compared to conventional nanostructured materials, and as a result demonstrates a high magnetic force, a high relative permittivity, and so forth.

Each of the first inorganic component and the second inorganic component constituting the nanoheterostructure of the present invention is preferably at least one component selected from the group consisting of metals, oxides, carbides, nitrides, borides, and salts, more preferably at least one component selected from the group consisting of metals and metal oxides.

Such metals are not particularly limited. Examples thereof include various metals of transition elements and main group elements (such as alkali metals and alkaline earth metals), and metalloids (such as boron, silicon, germanium, arsenic, antimony, tellurium, and polonium). These metals may be alone, or may be a mixture or alloy of two or more kinds of these.

Moreover, the oxides are not particularly limited, as long as the compounds contain oxygen and an element having a lower electronegativity than oxygen. Examples of the oxides include $CeO_2$, $RhO_2$, $Rh_2O_3$, $RuO_2$, $TiO_2$, $SnO_2$, $ZnO$, $Nb_2O_5$, $NbO_2$, $InO_3$, $ZrO_2$, $La_2O_3$, $Ta_2O_5$, $WO_3$, $Fe_2O_3$, $SiO_2$, $NiO$, $Cu_2O$, $Al_2O_3$, $SrTiO_3$, $BaTiO_3$, $CaTiO_3$, $PbTiO_3$, $BaZrO_3$, $PbZrO_3$, $CeZrO_4$, $AFe_2O_4$ (A is Mn, Co, Ni, Cu, Zn, or the like), and the like. These oxides may be alone, or may be a composite oxide of two or more kinds of these.

Further, the carbides are not particularly limited. Examples thereof include silicon carbide, boron carbide, iron carbide, cobalt carbide, and the like. These carbides may be alone, or may be a mixture of two or more kinds of these.

In addition, the nitrides are not particularly limited. Examples thereof include boron nitride, carbon nitride, silicon nitride, gallium nitride, indium nitride, aluminium nitride, tin nitride, titanium nitride, and the like. These nitrides may be alone, or may be a mixture of two or more kinds of these.

Furthermore, the borides are not particularly limited, as long as the borides form transition metals (such as lanthanides and actinides). Examples of the borides include $MgB_2$, $OsB_2$, $ReB_2$, $Nd_2Fe_{14}B$, $NaB_{15}$, $Mn_4B$, $V_3B$, $FeB$, $CoB$, $CrB_2$, and the like. These borides may be alone, or may be a mixture of two or more kinds of these.

Additionally, the salts are not particularly limited, as long as the salts are compounds in which negative ions (anions) derived from an acid are ionically bonded to positive ions (cations) derived from a base. Examples of the salts include carbonates, sulfates, phosphates, chlorides, and the like. Specific examples include $NH_4Cl$, $CuSO_4$, $NaHSO_4$, $NaH_2PO_4$, $NaCl$, $CaCl_2$, $CH_3COONa$, $Na_2CO_3$, $NaHCO_3$, $Na_2HPO_4$, $BaSO_4$, $Ca_3(OO_4)_2$, $CaCl(OH)$, $MgCl(OH)$, and the like. These salts may be alone, or may be a mixture of two or more kinds of these.

When such a nanoheterostructure of the present invention is used as a composite magnetic material, each of the first inorganic component and the second inorganic component is preferably a magnetic material. In this case, it is more preferably one of the first inorganic component and the second inorganic component be a hard magnetic material (for example, FePt, $SmCo_5$, $Nd_2Fe_{14}B$, or the like), and that the other be a soft magnetic material (for example, Fe, Co, a permalloy, a soft ferrite, or the like).

EXAMPLES

Hereinafter, the present invention will be more specifically described based on Examples and Comparative Examples. However, the present invention is not limited to the following examples.

Example 1

0.1 g of polystyrene-b-poly(4-vinylpyridine) (PS-b-P4VP) as a block copolymer, 0.038 g of titanium chloride as a Ti precursor, and 0.032 g of tin iodide as a Sn precursor were dissolved in 10 mL of toluene, and thereby a raw material solution was obtained. Note that PS of PS-b-P4VP had a molecular weight of $22 \times 10^3$, and P4VP had a molecular weight of $22 \times 10^3$. In addition, the solubility parameter differences of each component from the Ti precursor and the Sn precursor were as shown in Table 2 below.

TABLE 2

| | Solubility parameter difference $[(cal/cm^3)^{1/2}]$ | | |
|---|---|---|---|
| | PS | P4VP | toluene |
| Ti precursor | 2 or less | more than 2 | 2 or less |
| Sn precursor | more than 2 | 2 or less | more than 2 |

Next, the obtained raw material solution was placed in a heat treatment container in such a manner that the thickness would be approximately 500 μm after a heat treatment. The heat treatment was carried out in a nitrogen atmosphere at 850° C. for 6 hours, and further in a reducing atmosphere (Ar+4% $H_2$) at 600° C. for 1 hour. Thus, an inorganic structure was obtained.

Figure 2:
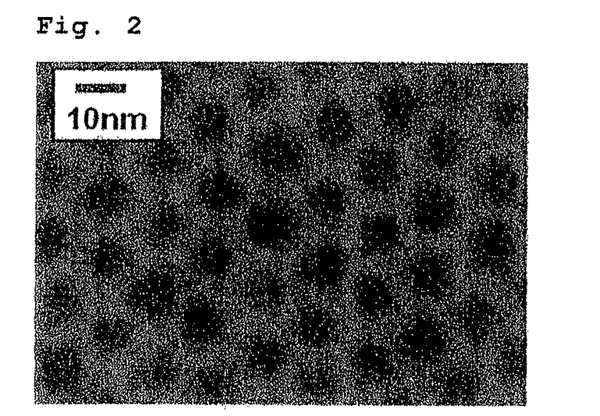
FIG. 2 is a transmission electron microphotograph of a nanoheterostructure obtained in Example 1.

The obtained inorganic structure was observed with a transmission electron microscope (TEM). As shown in FIG. 2, a nanoheterostructure was confirmed in which spherical Sn was three-dimensionally and periodically arranged in the Ti matrix.

Further, the small-angle X-ray diffraction pattern of the obtained inorganic structure was measured with a small-angle X-ray diffraction measuring device (manufactured by Rigaku Corporation, product name: NANO-Viewer). The distance (d) of the periodic structure was approximately 13.9 nm, and a characteristic diffraction peak pattern in a spherical structure (i.e., the ratio of intensities of diffraction spectra (q) at the peak position) was confirmed.

Example 2

The raw material solution obtained in the same manner as in Example 1 was placed in a heat treatment container in such a manner that the thickness would be approximately 500 μm after a heat treatment. The heat treatment was carried out in a nitrogen atmosphere at 850° C. for 6 hours, and further in air at 600° C. for 1 hour. Thus, an inorganic structure was obtained.

Figure 3:
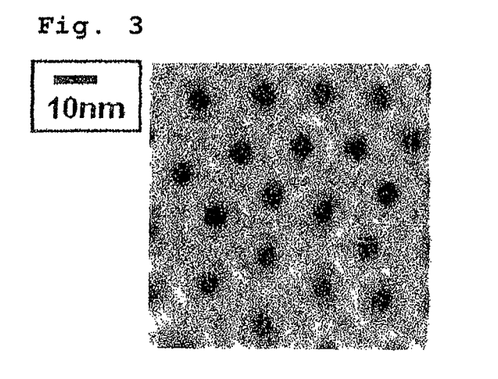
FIG. 3 is a transmission electron microphotograph of a nanoheterostructure obtained in Example 2.

The obtained inorganic structure was observed with a transmission electron microscope (TEM) as in Example 1. As shown in FIG. 3, a nanoheterostructure was confirmed in which spherical $SnO_2$ was three-dimensionally and periodically arranged in the $TiO_2$ matrix.

Further, the small-angle X-ray diffraction pattern of the obtained inorganic structure was measured as in Example 1. The distance (d) of the periodic structure was approximately 15.0 nm, and a characteristic diffraction peak pattern in a spherical structure (i.e., the ratio of intensities of diffraction spectra (q) at the peak position) was confirmed.

Comparative Example 1

0.1 g of poly(methyl methacrylate)-b-polyacrylonitrile (PMMA-b-PAN) as a block copolymer, 0.057 g of cobalt acetylacetonate as a Co precursor, and 0.030 g of titanium chloride as a Ti precursor were dissolved in 10 mL of toluene, and thereby a raw material solution was obtained. Note that PMMA of PMMA-b-PAN had a molecular weight of 27×10³, and PAA has a molecular weight of 24×10³. In addition, the solubility parameter differences of each component from the Co precursor and the Ti precursor were as shown in Table 3 below.

TABLE 3

| | Solubility parameter difference [(cal/cm³)^{1/2}] | | |
|---|---|---|---|
| | PAN | PMMA | toluene |
| Ti precursor | more than 2 | 2 or less | 2 or less |
| Co precursor | more than 2 | 2 or less | 2 or less |

Next, the obtained raw material solution was subjected to the heat treatment as in Example 1. Thus, an inorganic structure was obtained. The obtained inorganic structure was observed with a transmission electron microscope (TEM) as in Example 1. It was confirmed that no periodic structure was formed. Further, the small-angle X-ray diffraction pattern of the obtained inorganic structure was measured as in Example 1. A characteristic diffraction peak pattern in a periodic structure (i.e., the ratio of intensities of diffraction spectra (q) at the peak position) was not confirmed.

Example 3

0.1 g of polystyrene-b-poly(4-vinylpyridine) (PS-b-P4VP) as a block copolymer, 0.071 g of Fe(acac)₃ as a FePt precursor (Fe precursor and Pt precursor) that was a hard magnetic material, 0.079 g of Pt(acac)₂, and 0.035 g of CoCL₂(4Me-Py) (cobalt dichloride bis-4-methyl pyridine) as a Co precursor that was a soft magnetic material were dissolved in 10 mL of toluene, and thereby a raw material solution was obtained. Note that PS of PS-b-P4VP had a molecular weight of 22×10³, and P4VP had a molecular weight of 22×10³. In addition, the solubility parameter differences of each component from the FePt precursor (Fe precursor and Pt precursor) and the Co precursor were as shown in Table 4 below.

TABLE 4

| | Solubility parameter difference [(cal/cm³)^{1/2}] | | |
|---|---|---|---|
| | PS | P4VP | toluene |
| Fe precursor | 2 or less | more than 2 | 2 or less |
| Pt precursor | 2 or less | more than 2 | 2 or less |
| Co precursor | 2 or less | 2 or less | 2 or less |

Next, the obtained raw material solution was subjected to the heat treatment as in Example 1. Thus, an inorganic structure was obtained. The obtained inorganic structure was observed with a transmission electron microscope (TEM) as in Example 1. A nanoheterostructure was confirmed in which columnar FePt was three-dimensionally and periodically arranged in the Co matrix.

Figure 4:
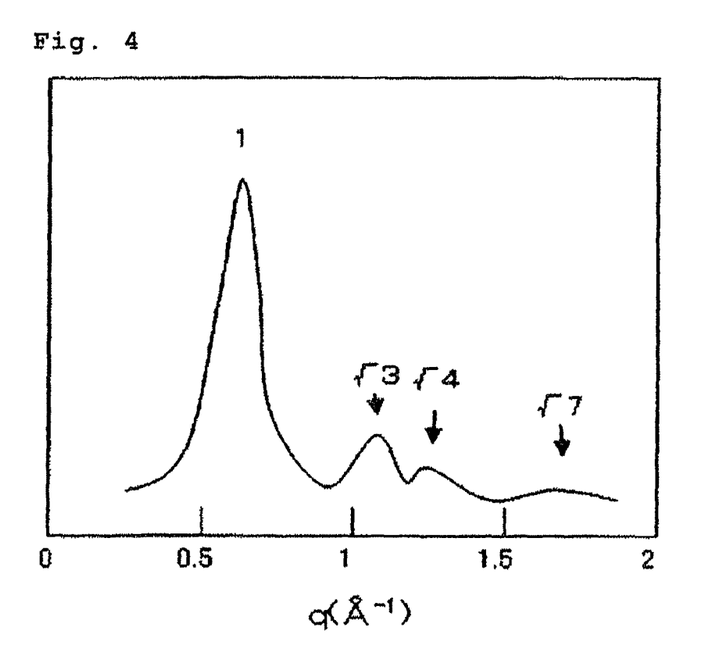
FIG. 4 is a graph showing a small-angle X-ray diffraction pattern of a nanoheterostructure obtained in Example 3.

Further, the small-angle X-ray diffraction pattern of the obtained inorganic structure was measured as in Example 1. The distance (d) of the periodic structure was approximately 10 nm, and a characteristic diffraction peak pattern in a columnar structure (i.e., the ratio of intensities of diffraction spectra (q) at the peak position) was confirmed as shown in FIG. 4.

Furthermore, the magnetization curve of the obtained inorganic structure was measured with a magnetization curve measuring device (manufactured by Toei Industry Co., Ltd., product name: Vibrating Sample Magnetometer). It was found out that the value of the maximum energy product of the obtained nanoheterostructure was 12% higher than that of an inorganic structure of a FePt single phase prepared for comparison.

Comparative Example 2

According to the method described in NPL 1, a composite material was prepared using, as a starting material, nanoparticles whose particle diameter had been controlled. Specifically, 6.8 mmol of oleic acid, 6.8 mmol of oleylamine, and 0.43 mmol of Fe(acac)₃ were dissolved in 20 mL of a 1-octanol solution containing Pd nanoparticles (Pd=0.17 mmol) having an average particle diameter of 5 nm and then heated at 180° C. to synthesize Pd/γ-Fe₂O₃ nanoparticles having a γ-Fe₂O₃ phase anisotropically grown on the surface of the Pd nanoparticles. The resultant was subjected to a calcination treatment in a reducing atmosphere (Ar+4% H₂). Thus, a composite material (FePd/Fe) was obtained.

The obtained composite material was observed with a transmission electron microscope (TEM) as in Example 1. It was confirmed that the particle diameter of the FePd nanoparticles dispersed in the Fe matrix and the distance among the particles greatly varied, and that no periodic structure was formed. Further, the small-angle X-ray diffraction pattern of the obtained composite material was measured as in Example 1. A characteristic diffraction peak pattern in a periodic structure (i.e., the ratio of intensities of diffraction spectra (q) at the peak position) was not confirmed.

Comparative Example 3

A composite material (FePt/Fe) was obtained in the same manner as in Comparative Example 2, except that Pt nanoparticles (Pt=0.17 mmol) having an average particle diameter of 8.2 nm were used in place of the Pd nanoparticles used in Comparative Example 2. The obtained composite material was observed with a transmission electron microscope (TEM) as in Example 1. It was confirmed that the particle diameter of the FePt nanoparticles dispersed in the Fe matrix and the distance among the particles greatly varied, and that no periodic structure was formed. Further, the small-angle X-ray diffraction pattern of the obtained composite material was measured as in Example 1. A characteristic diffraction peak pattern in a periodic structure (i.e., the ratio of intensities of diffraction spectra (q) at the peak position) was not confirmed.

Further, the magnetization curve of the obtained composite material was measured as in Example 3. It was found out that the value of the maximum energy product of the obtained composite material was as low as 42% of that of an inorganic structure of a FePt single phase prepared for comparison.

Example 4

The raw material solution obtained in the same manner as in Example 1 was placed in a heat treatment container in such a manner that the thickness would be approximately 500 μm after a heat treatment. The heat treatment was carried out in an ammonia atmosphere at 550° C. for 6 hours. Thus, an inorganic structure was obtained.

The obtained inorganic structure was observed with a transmission electron microscope (TEM) as in Example 1. A nanoheterostructure was confirmed in which spherical Sn nitride was three-dimensionally and periodically arranged in the Ti nitride matrix.

Further, the small-angle X-ray diffraction pattern of the obtained inorganic structure was measured as in Example 1. The distance (d) of the periodic structure was approximately 18.2 nm, and a characteristic diffraction peak pattern in a spherical structure (i.e., the ratio of intensities of diffraction spectra (q) at the peak position) was confirmed.

Example 5

0.1 g of polystyrene-b-poly(4-vinylpyridine) (PS-b-P4VP) as a block copolymer, 0.071 g of Fe(acac)$_3$ as a Fe precursor that was a hard magnetic material, and 0.035 g of CoCl$_2$(4Me-Py) (cobalt dichloride bis-4-methyl pyridine) as a Co precursor that was a soft magnetic material were dissolved in 10 mL of toluene, and thereby a raw material solution was obtained. Note that PS of PS-b-P4VP had a molecular weight of 22×10$^3$, and P4VP had a molecular weight of 22×10$^3$. Next, the obtained raw material solution was placed in a heat treatment container in such a manner that the thickness would be approximately 500 μm after a heat treatment. The heat treatment was carried out in an argon atmosphere at 900° C. for 12 hours. Thus, an inorganic structure was obtained.

The obtained inorganic structure was observed with a transmission electron microscope (TEM) as in Example 1. A nanoheterostructure was confirmed in which Fe carbide and Co carbide were alternately and periodically arranged and formed a multilayer structure.

Further, the small-angle X-ray diffraction pattern of the obtained inorganic structure was measured as in Example 1. The distance (d) of the periodic structure was approximately 21.6 nm, and a characteristic diffraction peak pattern in a lamellar structure (i.e., the ratio of intensities of diffraction spectra (q) at the peak position) was confirmed.

Example 6

The raw material solution obtained in the same manner as in Example 5 was placed in a heat treatment container in such a manner that the thickness would be approximately 500 μm after a heat treatment. The heat treatment was carried out together with B$_4$C in vacuum (10$^{-3}$ Torr) at 1150° C. for 6 hours. Thus, an inorganic structure was obtained.

The obtained inorganic structure was observed with a transmission electron microscope (TEM) as in Example 1. A nanoheterostructure was confirmed in which Fe boride and Co boride were alternately and periodically arranged and formed a multilayer structure.

Further, the small-angle X-ray diffraction pattern of the obtained inorganic structure was measured as in Example 1. The distance (d) of the periodic structure was approximately 17.4 nm, and a characteristic diffraction peak pattern in a lamellar structure (i.e., the ratio of intensities of diffraction spectra (q) at the peak position) was confirmed.

INDUSTRIAL APPLICABILITY

As described above, the production method of the present invention makes it possible to obtain the nanoheterostructure of the present invention in which an inorganic component having a three-dimensional specific nanoscale periodicity in such a shape as a spherical shape, a columnar shape, or a gyroid shape is arranged in a matrix made of another inorganic component.

Moreover, such a nanoheterostructure of the present invention has a structure that has not been formed by conventional production methods. It is possible to obtain nanoheterostructures in which the arrangement, composition, structure scale, and the like of various combinations of the multiple inorganic components are controlled in various ways.

Therefore, the nanoheterostructure of the present invention demonstrates an interface increasing effect, a nanosize effect, and significant improvements in durability and the like when compared to conventional nanostructured materials, and as a result demonstrates a high magnetic force, a high relative permittivity, and so forth. Accordingly, the nanoheterostructure of the present invention is useful as functional materials such as piezoelectric materials, thermoelectric materials, secondary cells, fine ceramics, magnetic materials and optical devices.

What is claimed is:

1. A method for producing a nanoheterostructure, comprising:
   a first step of preparing a raw material solution by dissolving, in a solvent,
      a block copolymer comprising at least a first polymer block component and a second polymer block component which are immiscible but linked to each other,
      a first inorganic precursor having a solubility parameter different from that of the first polymer block component by 2 (cal/cm$^3$)$^{1/2}$ or less, and
      a second inorganic precursor having a solubility parameter different from that of the second polymer block component by 2 (cal/cm$^3$)$^{1/2}$ or less; and
   a second step including
      a phase-separation treatment for forming a nanophase-separated structure in which at least a first polymer phase comprising the first polymer block component with the first inorganic precursor introduced thereinto and a second polymer phase comprising the second polymer block component with the second inorganic precursor introduced thereinto are regularly arranged by self-assembly,
      a conversion treatment for converting the first inorganic precursor and the second inorganic precursor to a first inorganic component and a second inorganic component, respectively, and
      a removal treatment for removing the block copolymer from the nanophase-separated structure, to thereby obtain a nanoheterostructure comprising the first inorganic component and the second inorganic component,
      said second step including a step of carrying out a heat treatment on the raw material solution in an inert gas atmosphere as the phase-separation treatment, the conversion treatment and the removal treatment.

2. The method for producing a nanoheterostructure according to claim 1, wherein a solubility parameter difference between the first polymer block component and the first inorganic precursor is smaller than a solubility parameter difference between the first polymer block component and the second inorganic precursor.

3. The method for producing a nanoheterostructure according to claim 1, wherein
   a solubility parameter difference between the first polymer block component and the first inorganic precursor is smaller than a solubility parameter difference between the first polymer block component and the second inorganic precursor, and a solubility parameter difference between the second polymer block component and the second inorganic precursor is smaller than a solubility parameter difference between the second polymer block component and the first inorganic precursor.

4. The method for producing a nanoheterostructure according to claim 1, wherein the solubility parameter difference between the first polymer block component and the second inorganic precursor is more than 2 $(cal/cm^3)^{1/2}$.

5. The method for producing a nanoheterostructure according to claim 1, wherein
the first inorganic precursor has a solubility parameter different from that of the second polymer block component by more than 2 $(cal/cm^3)^{1/2}$, and
the second inorganic precursor has a solubility parameter different from that of the first polymer block component by more than 2 $(cal/cm^3)^{1/2}$.

6. The method for producing a nanoheterostructure according to claim 1, wherein at least one of the first inorganic precursor and the second inorganic precursor has a solubility parameter different from that of the solvent by 2 $(cal/cm^3)^{1/2}$ or less.

7. The method for producing a nanoheterostructure according to claim 1, further comprising, after the heat treatment in the inert gas atmosphere, any one of:
an oxidization treatment for oxidizing the first inorganic component and the second inorganic component in an oxidizing gas atmosphere; and
a reduction treatment for reducing the first inorganic component and the second inorganic component in a reducing gas atmosphere.

8. A method for producing a nanoheterostructure comprising:
a first step of preparing a raw material solution by dissolving, in a solvent,
a block copolymer comprising at least a first polymer block component and a second polymer block component which are immiscible but linked to each other,
a first inorganic precursor having a solubility parameter different from that of the first polymer block component by 2 $(cal/cm^3)^{1/2}$ or less, and
a second inorganic precursor having a solubility parameter different from that of the second polymer block component by 2 $(cal/cm^3)^{1/2}$ or less; and
a second step including
a phase-separation treatment for forming a nanophase-separated structure in which at least a first polymer phase comprising the first polymer block component with the first inorganic precursor introduced thereinto and a second polymer phase comprising the second polymer block component with the second inorganic precursor introduced thereinto are regularly arranged by self-assembly,
a conversion treatment for converting the first inorganic precursor and the second inorganic precursor to a first inorganic component and a second inorganic component, respectively, and
a removal treatment for removing the block copolymer from the nanophase-separated structure, to thereby obtain a nanoheterostructure comprising the first inorganic component and the second inorganic component,
said nanoheterostructure comprising the first inorganic component and the second inorganic component one of which is a matrix, and the other of which is three-dimensionally and periodically arranged in the matrix, and
said nanoheterostructure having a three-dimensional periodic structure whose average value of one unit length of a repeated structure is 1 nm to 100 nm.

9. The method for producing a nanoheterostructure according to claim 8, wherein the inorganic component three-dimensionally and periodically arranged in the matrix has a shape selected from the group consisting of a spherical shape, a columnar shape, and a gyroid shape.

* * * * *